(12) United States Patent
Park et al.

(10) Patent No.: US 8,395,160 B2
(45) Date of Patent: Mar. 12, 2013

(54) ORGANIC LIGHT EMITTING DISPLAY APPARATUS AND METHOD OF MANUFACTURING THE SAME

(75) Inventors: Sun Park, Yongin (KR); Chun-Gi You, Yongin (KR); Jong-Hyun Park, Yongin (KR); Jin-Hee Kang, Yongin (KR); Yul-Kyu Lee, Yongin (KR)

(73) Assignee: Samsung Display Co., Ltd., Yongin-si (KR)

( * ) Notice: Subject to any disclaimer, the term of this patent is extended or adjusted under 35 U.S.C. 154(b) by 201 days.

(21) Appl. No.: 12/943,886

(22) Filed: Nov. 10, 2010

(65) Prior Publication Data

US 2011/0114956 A1 May 19, 2011

(30) Foreign Application Priority Data

Nov. 13, 2009 (KR) .................. 10-2009-0109706

(51) Int. Cl.
*H01L 27/14* (2006.01)
*H01L 29/04* (2006.01)
*H01L 29/15* (2006.01)
*H01L 31/036* (2006.01)

(52) U.S. Cl. ............... 257/72; 257/59; 257/99; 438/158; 438/687; 349/39; 349/42; 349/43; 349/46; 349/139

(58) Field of Classification Search .............. 257/59, 257/72, 99; 438/158, 687; 349/39, 42, 43, 349/46, 139
See application file for complete search history.

(56) References Cited

U.S. PATENT DOCUMENTS

| 5,650,834 A * | 7/1997 | Nakagawa et al. ........... 349/139 |
| 6,432,755 B2 * | 8/2002 | Sung et al. .................... 438/158 |
| 6,750,475 B1 * | 6/2004 | Izumi et al. ..................... 257/59 |
| 7,652,740 B2 * | 1/2010 | Hwang et al. ................ 349/147 |
| 2003/0213966 A1 * | 11/2003 | Yang et al. ...................... 257/93 |
| 2006/0094241 A1 * | 5/2006 | Park et al. ..................... 438/689 |
| 2010/0022041 A1 * | 1/2010 | Lee et al. ........................ 438/29 |
| 2010/0144076 A1 * | 6/2010 | Park ................................ 438/34 |

FOREIGN PATENT DOCUMENTS

| JP | 2006-095976 | 4/2006 |
| JP | 2007-250804 | 9/2007 |
| KR | 10-2003-0054795 | 7/2003 |
| KR | 10-2004-0037889 A | 5/2004 |
| KR | 10-0709195 | 4/2007 |
| KR | 10-2007-0068092 A | 6/2007 |

OTHER PUBLICATIONS

KIPO Office action dated May 24, 2011 in priority Korean application No. 10-2009-0109706, 6 pps.

* cited by examiner

*Primary Examiner* — Jarrett Stark
*Assistant Examiner* — John M Parker
(74) *Attorney, Agent, or Firm* — Christie, Parker & Hales, LLP (57) ABSTRACT

An organic light emitting display apparatus and a method of manufacturing the organic light emitting display apparatus, whereby the manufacturing process is simplified and the electric characteristics of the organic light emitting display apparatus are improved. The organic light emitting display apparatus includes: a gate electrode that includes a first conductive layer including ITO, a second conductive layer on the first conductive layer, a third conductive layer on the second conductive layer and including ITO, and a fourth conductive layer on the third conductive layer and including IZO or AZO; and a pixel electrode formed in the same layer level as the gate electrode and including a first electrode layer that includes ITO, a second electrode layer on the first electrode layer, a third electrode layer on the second electrode layer and including ITO, and a fourth electrode layer on the third electrode layer and including IZO or AZO.

23 Claims, 5 Drawing Sheets

ORGANIC LIGHT EMITTING DISPLAY APPARATUS AND METHOD OF MANUFACTURING THE SAME

CROSS-REFERENCE TO RELATED APPLICATION

This application claims priority to and the benefit of Korean Patent Application No. 10-2009-0109706, filed on Nov. 13, 2009, in the Korean Intellectual Property Office, the entire content of which is incorporated herein by reference.

BACKGROUND

1. Field

One or more embodiments of the present invention relate to an organic light emitting display apparatus and a method of manufacturing the same, and more particularly, to an organic light emitting display apparatus and a method of manufacturing the same, in which manufacturing processes may be simplified and electric characteristics of the organic light emitting display apparatus may be improved.

2. Description of the Related Art

Developments in display technology have led to the replacement of conventional display apparatus with portable, thin flat panel display apparatuses. From among the flat panel apparatuses, an electroluminescent display apparatus, which is a self-emissive display apparatus, has a wide viewing angle, high contrast ratio, and high response speed, and thus has been considered as the next-generation display apparatus. In addition, in comparison to an inorganic light emitting display apparatus, an organic light-emitting display apparatus having a light emitting layer formed of an organic material has better properties in terms of brightness, driving voltage, and response speed: and can realize multiple colors.

The organic light emitting display apparatus includes a cathode electrode, an anode electrode, and an organic light emitting layer between the cathode and anode electrodes; and as a voltage is applied to the cathode and anode electrodes, visible light is emitted from the organic light emitting layer connected to the cathode and anode electrodes.

The organic light emitting display apparatus includes a plurality of thin films, and in each thin film, a minute pattern of a desired form is formed. To form the minute pattern, various suitable processes are performed. The pattern may be formed by using various suitable methods, but usually, a photolithography method using a mask is used.

The photolithography method requires precise controlling. Also, when forming a pattern using a mask, various suitable operations such as forming a photoresist, exposure, development, etching, or the like are required. Thus, the frequency that the photolithography method using a mask is used is increased, the manufacturing process of the organic light emitting display apparatus is complicated, and the manufacturing time thereof is increased. Also, it is difficult to control the manufacturing process and thus many defects may occur.

In addition, the organic light emitting display apparatus includes various suitable electrodes which are formed of conductive thin films. The electric characteristics and light emitting characteristics of the organic light emitting display apparatus are likely to vary according to the electric characteristics of these electrodes.

SUMMARY

Aspects of embodiments of the present invention are directed toward an organic light emitting display apparatus and a method of manufacturing the organic light emitting apparatus, wherein the manufacturing process of the organic light emitting display apparatus may be simplified and the electric characteristics of the organic light emitting display apparatus may be improved.

Additional aspects will be set forth in part in the description which follows and, in part, will be apparent from the description, or may be learned by practice of the presented embodiments.

According to an embodiment of the present invention, an organic light emitting display apparatus includes: a substrate; an active layer on the substrate; a gate electrode insulated from the active layer and composed of a first conductive layer including ITO, a second conductive layer on the first conductive layer, a third conductive layer on the second conductive layer and including ITO, and a fourth conductive layer on the third conductive layer and including IZO or AZO; a pixel electrode formed in the same layer level as the gate electrode and composed of a first electrode layer including ITO, a second electrode layer on the first electrode layer, a third electrode layer on the second electrode layer and including ITO, and a fourth electrode layer on the third electrode layer and including IZO or AZO; a source electrode and a drain electrode, the source and drain electrodes being insulated from the gate electrode and electrically coupled to the active layer; an intermediate layer on the pixel electrode and including an organic light emitting layer; and a counter electrode on the intermediate layer, wherein the pixel electrode is electrically coupled to the source electrode or the drain electrode.

In one embodiment, the third electrode layer includes crystallized ITO.

In one embodiment, the intermediate layer contacts the third electrode layer of the pixel electrode.

In one embodiment, the source electrode or the drain electrode contacts the fourth electrode layer of the pixel electrode.

In one embodiment, the fourth electrode layer of the pixel electrode includes a first opening portion to expose the third electrode layer disposed below the fourth electrode layer. Here, the organic light emitting display apparatus may further include a planarization layer for insulating the gate electrode from the source electrode and the drain electrode, the source electrode and the drain electrode may be on the planarization layer, and the planarization layer may include a second opening portion corresponding to the first opening portion. The organic light emitting display apparatus may further include a pixel define layer on the planarization layer, and covering the source electrode and the drain electrode, the pixel define layer may include a third opening portion contacting the first opening portion or formed in the first opening portion, and the intermediate layer may contact the third electrode layer through the third opening portion.

In one embodiment, the second conductive layer includes Ag or Al.

In one embodiment, the organic light emitting display apparatus further includes a capacitor composed of a capacitor first electrode layer formed in the same layer level as the active layer and physically separated from the active layer, and a capacitor second electrode layer insulated from the capacitor first electrode layer and formed in the same layer level as the gate electrode to correspond to the capacitor first electrode layer. The capacitor second electrode layer may include a first layer including ITO, a second layer on the first layer, a third layer on the second layer and including ITO, and a fourth layer on the third layer and including IZO or AZO. The second layer may include Ag or Al.

According to an embodiment of the present invention, a method of manufacturing an organic light emitting display apparatus, includes: forming an active layer on a substrate; forming a gate electrode insulated from the active layer and composed of a first conductive layer including ITO, a second conductive layer on the first conductive layer, a third conductive layer on the second conductive layer and including ITO, and a fourth conductive layer on the third conductive layer and including IZO or AZO; forming a pixel electrode in the same layer level as the gate electrode and composed of a first electrode layer including ITO, a second electrode layer on the first electrode layer, a third electrode layer on the second electrode layer and including ITO, and a fourth electrode layer on the third electrode layer and including IZO or AZO; forming a source electrode and a drain electrode to be insulated from the gate electrode and electrically coupled to the active layer; forming an intermediate layer on the pixel electrode and including an organic light emitting layer; and forming a counter electrode on the intermediate layer, wherein the pixel electrode is electrically coupled to the source electrode or the drain electrode.

In one embodiment, the forming of the gate electrode and the forming of the pixel electrode are performed at the same time.

In one embodiment, the forming of the pixel electrode includes crystallizing the third electrode layer.

In one embodiment, the intermediate layer is formed to contact the third electrode layer of the pixel electrode.

In one embodiment, the source electrode or the drain electrode is formed to contact the fourth electrode layer of the pixel electrode.

In one embodiment, the method further includes forming a first opening portion in the fourth electrode layer to expose the third electrode layer before the forming of the intermediate layer. In one embodiment, the method may further include forming a planarizing layer on the gate electrode and the pixel electrode to insulate the gate electrode from the source electrode and the drain electrode, wherein the planarization layer may include a second opening portion corresponding to the first opening portion. The first opening portion may be formed by removing the fourth electrode layer exposed through the second opening portion after forming the second opening portion. The method may further include forming a pixel define layer on the planarizing layer, covering the source electrode and the drain electrode, wherein the pixel define layer may include a third opening portion contacting the first opening portion or formed in the first opening portion, and wherein the intermediate layer may be formed to contact the third electrode layer through the third opening portion.

In one embodiment, the method may further include: forming a capacitor first electrode layer in the same layer level as the active layer and physically separated from the active layer; and forming a capacitor second electrode layer to be insulated from the capacitor first electrode layer and to correspond to the capacitor first electrode layer and in the same layer level as the gate electrode. The forming of the capacitor second electrode layer may include forming a first layer including ITO, a second layer on the first layer, a third layer on the second layer and including ITO, and a fourth layer on the third layer and including IZO or AZO. The second layer may include Ag or Al.

BRIEF DESCRIPTION OF THE DRAWINGS

The accompanying drawings, together with the specification, illustrate exemplary embodiments of the present invention, and, together with the description, serve to explain the principles of the present invention.

DETAILED DESCRIPTION

Reference will now be made in detail to embodiments, examples of which are illustrated in the accompanying drawings, wherein like reference numerals refer to the like elements throughout. In this regard, the present embodiments may have different forms and should not be construed as being limited to the descriptions set forth herein. Accordingly, the embodiments are merely described below, by referring to the figures, to explain aspects of the present description.

Figure 1:
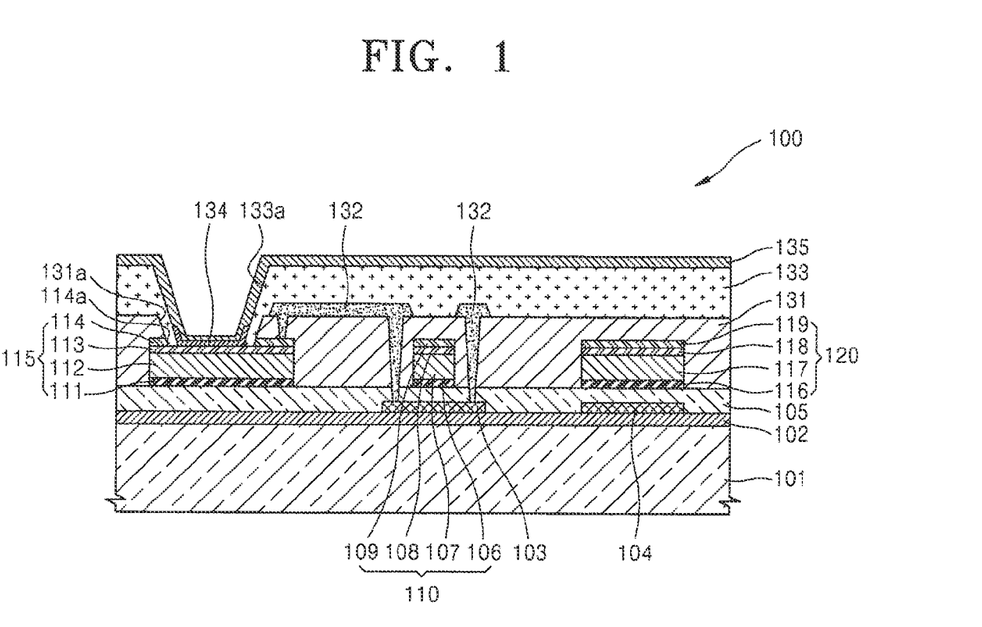
FIG. 1 is a cross-sectional view of an organic light emitting display apparatus according to an embodiment of the present invention.

FIG. 1 is a cross-sectional view of an organic light emitting display apparatus 100 according to an embodiment of the present invention.

The organic light emitting display apparatus 100 includes a substrate 101, an active layer 103, a gate electrode 110, a pixel electrode 115, a source/drain electrode 132, an intermediate layer 134, and a counter electrode 135.

The substrate 101 may be formed of transparent glass containing $SiO_2$ as a main component, but is not limited thereto. For example, the substrate 101 may also be formed of a transparent plastic material that may be an insulating organic material selected from the group consisting of polyethersulphone (PES), polyacrylate (PAR), polyetherimide (PEI), polyethyelene napthalate (PEN), polyethyelene terephthalate (PET), polyphenylene sulfide (PPS), polyallylate, polyimide, polycarbonate (PC), triacetate cellulose (TAC), and cellulose acetate propionate (CAP).

In a bottom emission type organic light-emitting display apparatus in which an image is directed toward and/or realized through the substrate 101, the substrate 101 is, in one embodiment, formed of a transparent material. However, in a top emission type organic light-emitting display apparatus in which an image is directed and/or realized away from the substrate 101, the substrate 101 does not have to be formed of a transparent material, and, in this case, the substrate 101 may be formed of metal. When the substrate 101 is formed of metal, the substrate 101 may include at least one metal selected from the group consisting of carbon (C), iron (Fe), chromium (Cr), manganese (Mg), nickel (Ni), titanium (Ti), molybdenum (Mo), stainless steel (SUS), Invar alloys, Inconel alloys, and Kovar alloys. However, the embodiment of the present invention is not limited to the above examples. In one embodiment, the substrate 101 is formed of a metal foil.

In order to form a planarized surface on the substrate 101 and to prevent impurity elements from penetrating into the substrate 101, a buffer layer 102 may be formed on the substrate 101. The buffer layer 102 may be formed of $SiO_2$ and/or $SIN_X$.

The active layer 103 having a set or predetermined pattern is formed on the buffer layer 102. The active layer 103 may be formed of an inorganic semiconductor such as amorphous silicon or polysilicon, or an organic semiconductor, and includes a source region, a drain region, and a channel region. The source and drain regions may be formed by doping the active layer 103, which is formed of amorphous silicon or polysilicon, with impurities. When the source and drain regions are doped with a Group III element such as Boron (B), a p-type semiconductor may be formed. When the source and drain regions are doped with a Group V element such as nitrogen (N), an n-type semiconductor may be formed.

A capacitor first electrode 104 may be formed on the buffer layer 102 to be separated from the active layer 103. The capacitor first electrode 104 may be formed of an inorganic semiconductor such as amorphous silicon or polysilicon, or an organic semiconductor.

A gate insulation layer 105 is formed on the buffer layer 102 and covers the active layer 103 and the capacitor first electrode 104. The gate insulation layer 105 is for insulating the active layer 103 and the gate electrode 110 from each other, and may be formed of an inorganic material such as $SiN_x$ and $SiO_2$.

The gate electrode 110 is formed on the gate insulation layer 104. The gate electrode 110 is connected to a gate line via which a TFT on/off signal is applied.

The gate electrode 110 includes a first conductive layer 106 including ITO, a second conductive layer 107, a third conductive layer 108 containing ITO, and a fourth conductive layer 109 containing ISO or AZO. The second conductive layer 107 may contain Ag or Al. However, since Al and ITO have large potential differences, Al may be abruptly damaged due to the Galvanic effect. Thus when the second conductive layer 107 contains Al, the thickness of the third conductive layer 108 may be increased and the third conductive layer 108 may cover an upper surface of the second conductive layer 107 sufficiently so that the upper surface of the second conductive layer 107 is not exposed or is completely covered by the third conductive layer 108.

The gate electrode 110 according to the current embodiment includes the second conductive layer 107 including Ag or Al to reduce resistance of the gate electrode 110, and the first conductive layer 106 including ITO is disposed under the second conductive layer 107 to increase bonding characteristics between the first conductive layer 106 and the gate insulation layer 105. Also, the third conductive layer 108 and the fourth conductive layer 109 are sequentially stacked on the second conductive layer 107, thereby increasing a resistance reduction effect of the gate electrode 110. Also, the fourth conductive layer 109 including IZO or AZO may protect the third conductive layer 108. The third conductive layer 108 of the gate electrode 110 may include crystallized ITO, specifically, polycrystalline ITO. The polycrystalline ITO is denser than amorphous ITO and has high durability; and due to the third conductive layer 108 including crystallized ITO, the durability of the gate electrode 110 is improved.

The pixel electrode 115 is formed on the gate insulation layer 105 separately from the gate electrode 110. The pixel electrode 115 includes a first electrode layer 111 including ITO, a second electrode layer 112, a third electrode layer 113 including ITO, and a fourth electrode layer 114 including IZO or AZO. The second electrode layer 112 may include Ag or Al.

However, since Al and ITO have large potential differences, Al may be abruptly damaged due to the Galvanic effect. Thus when the second electrode layer 112 contains Al, the thickness of the third electrode layer 113 may be increased and the third electrode layer 113 may cover an upper surface of the second electrode layer 112 sufficiently so that the upper surface of the second electrode layer 112 is not exposed or is completely covered by the third electrode layer 113.

The fourth electrode layer 114 includes a first opening portion 114a that exposes the third electrode layer 113. Accordingly, the intermediate layer 134 contacts the third electrode layer 113. The third electrode layer 113 including ITO includes crystallized ITO, specifically, polycrystalline ITO. The polycrystalline ITO is denser than amorphous ITO and has high durability.

The pixel electrode 115 is formed of the same materials as the gate electrode 110. The pixel electrode 115 includes the second electrode layer 112 that includes Ag or Al, thereby reducing resistance of the pixel electrode 115. The first electrode layer 111 including ITO is disposed below the first electrode layer 111, thereby increasing the bonding characteristics between the second electrode layer 112 and the gate insulation layer 105. Also, the third electrode layer 113 and the fourth electrode layer 114 are sequentially stacked on the second electrode layer 112 to further increase the resistance reducing effect of the pixel electrode 115.

Also, the pixel electrode 115 is bonded to the intermediate layer 134, and the electrical characteristics and the light emitting characteristics of the organic light emitting display apparatus 100 are influenced by the bonding characteristics between the pixel electrode 115 and the intermediate layer 134. Accordingly, the surface characteristics of a portion of the pixel electrode 115 contacting the intermediate layer 134 are important. The third electrode layer 113 of the pixel electrode 115 contacts the intermediate layer 134, includes polycrystalline ITO, and has high durability. Thus, the surface of the pixel electrode 115 is prevented or protected from damaging even when undergoing a subsequent process, particularly, an etching process. As a result, the bonding characteristics between the third electrode layer 113 and the intermediate layer 134 are improved.

In addition, a capacitor second electrode 120 may be formed on the gate insulation layer 105 to correspond to the capacitor first electrode 104. The capacitor second electrode 120 may be formed of the same materials as the gate electrode 110. That is, the capacitor second electrode 120 includes a first layer 116 including ITO, a second layer 117, a third layer 118 including ITO, and a fourth layer 119 including IZO or AZO. The second layer 117 may include Ag or Al. However, since Al and ITO have large potential differences, Al may be abruptly damaged due to the Galvanic effect. Thus when the second layer 117 contains Al, the thickness of the third layer 118 may be increased and the third layer 118 may cover an upper surface of the second layer 117 sufficiently so that the upper surface of the second layer 117 is not exposed or is completely covered by the third layer 118.

The capacitor first electrode 104 and the capacitor second electrode 120 that are respectively formed on and below the gate insulation layer 105 to form one capacitor are formed in the same layer level as the active layer 103 and the gate electrode 110, respectively. Accordingly, the thickness of the organic light emitting display apparatus 100 may be efficiently reduced.

The capacitor second electrode 120 according to the current embodiment includes the second layer 117 including Ag or Al to reduce resistance of the capacitor second electrode 120, and the first layer 116 including ITO is disposed under the second layer 117 to increase bonding characteristics between the first layer 116 and the gate insulation layer 105 therebelow. Also, the third layer 118 and the fourth layer 119 are sequentially stacked on the second layer 117, thereby increasing a resistance reduction effect of the capacitor second electrode 120. Also, the fourth layer 119 including IZO or AZO may protect the third layer 118. The third layer 118 of the capacitor second electrode 120 may include crystallized ITO, specifically, polycrystalline ITO. The polycrystalline ITO is denser than amorphous ITO and has high durability, and due to the third layer 118 including crystallized ITO, the durability of the capacitor second electrode 120 is improved.

A planarization layer 131 is formed on the gate insulating layer and covers the gate electrode 110, the pixel electrode 115, and the capacitor second electrode 120. The planarization layer 131 may be formed of various suitable insulation materials. For example, the planarization layer 131 may be formed of an inorganic material such as an oxide or a nitride, or an organic material.

In one embodiment, an inorganic insulation layer for forming the planarization layer 131 includes $SiO_2$, $SiN_x$, $SiON_x$, $Al_2O_3$, $TiO_2$, $Ta_2O_5$, $HfO_2$, $ZrO_2$, BST, and/or PZT. In one embodiment, an organic insulation layer for forming the planarization layer 131 includes a general-use polymer (PMMA, PS), a polymer derivative having a phenol group, an acrylic polymer, an imide-based polymer, an arylether-based polymer, an amide-based polymer, a fluorine polymer, a p-xylene-based polymer, and/or a vinyl alcohol-based polymer. The planarization layer 131 may be formed of a composite stack of an organic insulation layer and an organic insulation layer.

The planarization layer 131 includes a second opening portion 131a that corresponds to the first opening portion 114a.

The planarization layer 131 includes a contact hole exposing the source/drain region of the active layer 103. A source/drain electrode 132 may be formed to respectively contact the source/drain region of the active layer 103 via the contact hole. The source/drain electrode 132 is connected to the pixel electrode 115; in more detail, the source/drain electrode 132 is connected to the fourth electrode layer 114 of the pixel electrode 115.

The source/drain electrode 132 may have a three-layer structure, for example, a Ti/Al/Ti structure.

A pixel define layer 133 is formed on the planarization layer 131 and covers the source/drain electrode 132. The pixel define layer 133 includes a third opening portion 133a that exposes the third electrode layer 113 of the pixel electrode 115. The third opening portion 133a is formed to contact the first opening portion 114a or is formed in the first opening portion 114a. The pixel define layer 133 may be formed of an organic material or an inorganic material.

The intermediate layer 134 is formed in the third opening portion 133a to contact the third electrode layer 113 of the pixel electrode 115. The intermediate layer 134 includes an organic light emitting layer.

The intermediate layer 134 emits light by the electric driving of the pixel electrode 115 and the counter electrode 135.

The intermediate layer 134 is formed of an organic material. When the organic light emitting layer included in the intermediate layer 134 is formed of a small molecule organic material, a hole injection layer (HIL) and a hole transport layer (HTL) are disposed between the organic light emitting layer and the pixel electrode 115, and an electron transport layer (ETL) and an electron injection layer (EIL) are disposed between the organic light emitting layer and the counter electrode 135. Other suitable layers may also be stacked according to necessity. Examples of the organic material for forming the intermediate layer 134 include copper phthalocyanine (CuPc), N,N'-Di(naphthalene-1-yl)-N,N'-diphenyl-benzidine (NPB), tris-8-hydroxyquinoline aluminum (Alq3), etc.

When the organic light emitting layer is formed of a polymer organic material, the intermediate layer 134 may include only an HTL that is disposed between the organic light emitting layer and the pixel electrode 115. The HTL may be formed of, for example, poly(2,4-ethylenedioxythiophene) (PEDOT) or polyaniline, on the pixel electrode 115 by using an inkjet printing method or a spin coating method. The polymer organic light emitting layer may be formed of PPV, soluble PPV's, cyano-PPV, polyfluorene, etc.; and a color pattern may be formed in the organic light emitting layer by using an inkjet printing method, a spin coating method, and/or a thermal transfer method using laser.

The counter electrode 135 may be formed on the intermediate layer 134. The counter electrode 135 may be formed by depositing a metal having a low work function, such as Ag, Mg, Al, Pt, Pd, Au, Ni, Nd, Ir, Cr, Li, Ca, and a compound of these, and depositing a transparent conductive material such as ITO, IZO, ZnO, or $In_2O_3$ thereon.

A sealing member may be formed on the counter electrode 135. The sealing member is formed to protect the intermediate layer 134 or other layers from external water and/or oxygen, and is formed of a transparent material. To this end, the sealing member may be formed of glass, plastic, or a multilayer structure of organic and inorganic materials.

FIGS. 2A through 2G are cross-sectional views illustrating a method of manufacturing the organic light emitting display apparatus 100 of FIG. 1, according to an embodiment of the present invention.

Operations of the method will be described sequentially in manufacturing order with reference to FIGS. 2A through 2G.

Figure 2A:
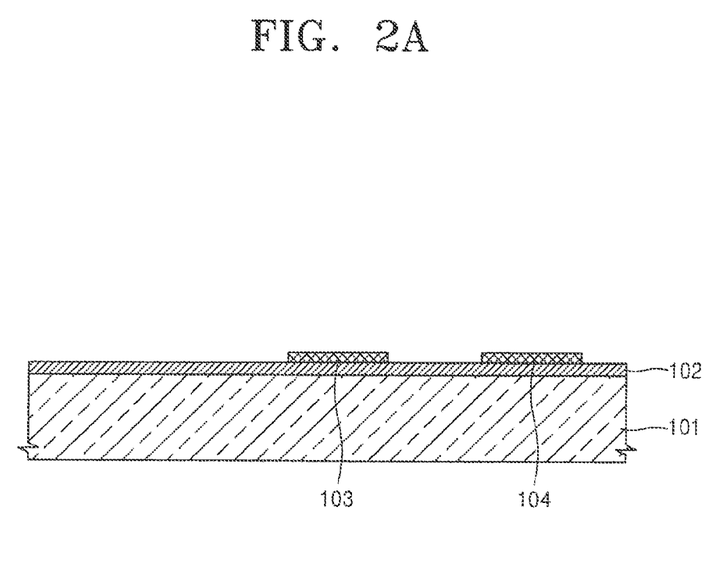
FIGS. 2A through 2G are cross-sectional views illustrating a method of manufacturing the organic light emitting display apparatus of FIG. 1, according to an embodiment of the present invention.

First, referring to FIG. 2A, a buffer layer 102 is formed on a substrate 101, and an active layer 103 and a capacitor first electrode 104 are formed on the buffer layer 102. The active layer 103 and the capacitor first electrode 104 each have a set or predetermined pattern so as to be physically separated from each other. The active layer 103 and the capacitor first electrode 104 may be formed at the same time by using a photolithography method using one mask.

Figure 2B:
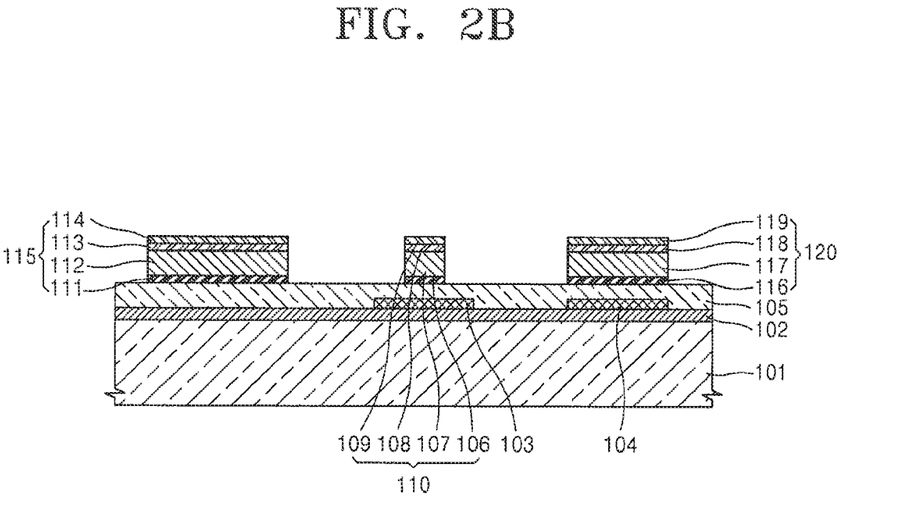

Next, referring to FIG. 2B, a gate insulation layer 105 is formed on the substrate 101, and covers the active layer 103 and the capacitor first electrode 104, and then a gate electrode 110, a pixel electrode 115, and a capacitor second electrode 120 are formed on the gate insulation layer 105. The gate electrode 110, the pixel electrode 115, and the capacitor second electrode 120 are formed by stacking the same materials and using a photolithography method using one mask.

In more detail, the gate electrode 110, the pixel electrode 115, and the capacitor second electrode 120 are formed by forming an ITO/Ag/ITO/IZO(AZO) structure or a ITO/Al/ITO/IZO(AZO) structure and then patterning the structure to desired patterns by using a photolithography method. As a result, the gate electrode 110 is formed by sequentially forming a first conductive layer 106 including ITO, a second conductive layer 107 including Ag or Al, a third conductive layer 108 including ITO, and a fourth conductive layer 109 including IZO or AZO. Also, the pixel electrode 115 is formed by sequentially stacking a first electrode layer 111 including ITO, a second electrode layer 112 including Ag or Al, a third electrode layer 113 including ITO, and a fourth electrode layer 114 including IZO or AZO. The capacitor second electrode 120 is formed by sequentially stacking a first layer 116 including ITO, a second layer 117 including Ag or Al, a third layer 118 including ITO, and a fourth layer 119 including IZO or AZO.

The third electrode layer 113 of the pixel electrode 115 is crystallized. That is, the third electrode layer 113 includes crystallized ITO. To this end, the third electrode layer 113 is crystallized by using a thermal process before forming the fourth electrode layer 114. In more detail, the third electrode layer 113 may include polycrystalline ITO.

The third conductive layer 108 of the gate electrode 110 formed in the same layer level as the third electrode layer 113 of the pixel electrode 115 and the third layer 118 of the capacitor second electrode 120 are also crystallized, thereby including crystallized ITO.

The crystallized ITO is denser and has high durability, and thus a surface thereof is not damaged during subsequent processes. In addition, as the surface of the crystallized ITO is not damaged, the bonding characteristics between the crystallized ITO and other layers may be improved.

Figure 2C:
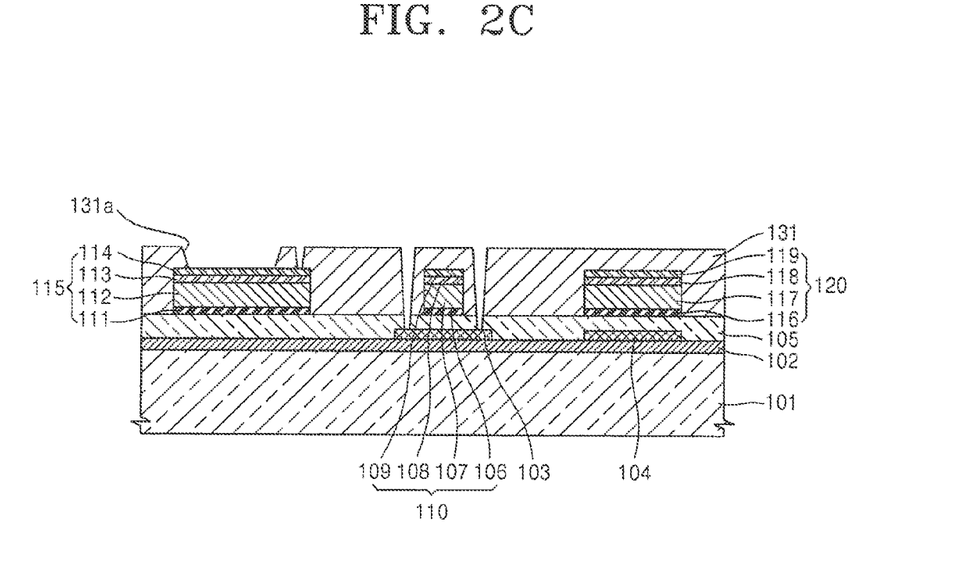

Next, referring to FIG. 2C, a planarization layer 131 is formed of an insulation material on the gate insulation layer 105, and covers the gate electrode 110, the pixel electrode 115, and the capacitor second electrode 120. A contact hole is formed in the planarization layer 131. A source/drain region of the active layer 103 may be exposed through the contact hole formed in the planarization layer 131. To form the contact hole, a photolithography method may be used. Also, a second opening portion 131a may be formed in the planarization layer 131. The fourth electrode layer 114 of the pixel electrode 115 is exposed through the second opening portion 131a. Also, a hole that exposes the fourth electrode layer 114 of the pixel electrode 115 is further formed in the planarization layer 131 so as to connect the pixel electrode 115 and a source/drain electrode to be formed later.

Figure 2D:
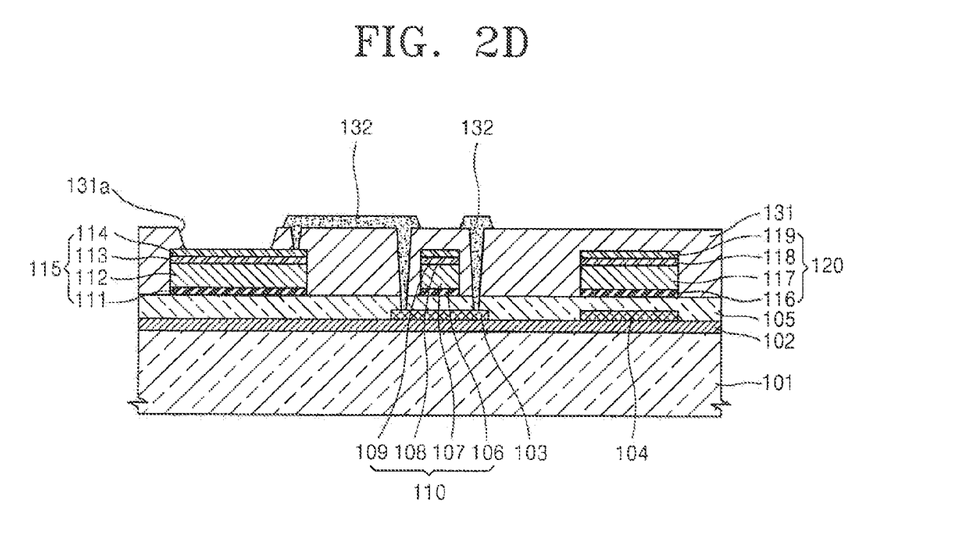

Next, referring to FIG. 2D, a source/drain electrode 132 is formed, The source/drain electrode 132 contacts a source/drain region of the active layer 103. Also, the source/drain electrode 132 contacts the pixel electrode 115, specifically, the fourth electrode layer 114 of the pixel electrode 115.

The source/drain electrode 132 may each be formed of a multi-layer structure including various suitable conductive layers, specifically, a Ti/Al/Ti structure.

Figure 2E:
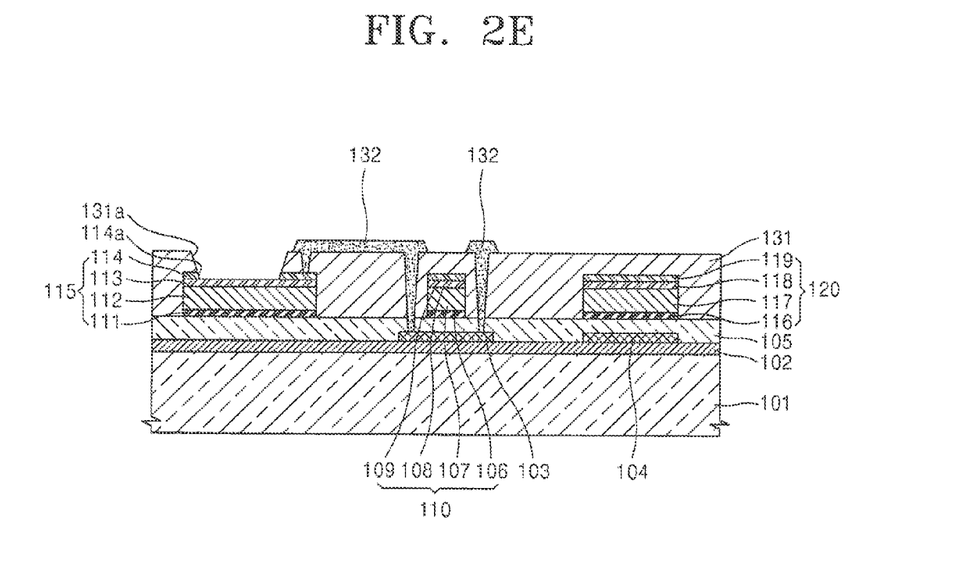

Next, referring to FIG. 2E, a first opening portion 114a is formed in the fourth electrode layer 114 of the pixel electrode 115. The first opening portion 114a is formed in the fourth electrode layer 114 by etching the fourth electrode layer 114 that is exposed through the second opening portion 131a formed in the planarization layer 131. The first opening portion 114a is formed to correspond to the second opening portion 131a.

A wet etching process (in which an etching solution such as an oxalic acid solution, a nitric acid solution, a sulfuric acid solution, and/or a cerium ammonium nitride (CAN) solution is used) may be utilized to etch the fourth electrode layer 114. However, the embodiment of the present invention is not limited thereto. Alternatively, various other suitable etching solutions for etching IZO or AZO, such as a phosphoric acid solution or an acetic acid solution, may be used.

While forming the first opening portion 114a by etching the fourth electrode layer 114, the third electrode layer 113 is not substantially affected by the etching solution and thus is not etched. This is because the third electrode layer 113 includes crystallized ITO and thus has increased durability and higher resistance to etching. As such, while etching the fourth electrode layer 114 including IZO or AZO, the third electrode layer 113 is not etched (or not substantially etched). Accordingly, a surface of a portion of the pixel electrode 115 that is not covered by the planarization layer 131 and thus is exposed, is not damaged, thereby increasing the bonding characteristics between the pixel electrode 115 and an intermediate layer to be formed in a subsequent process.

Figure 2F:
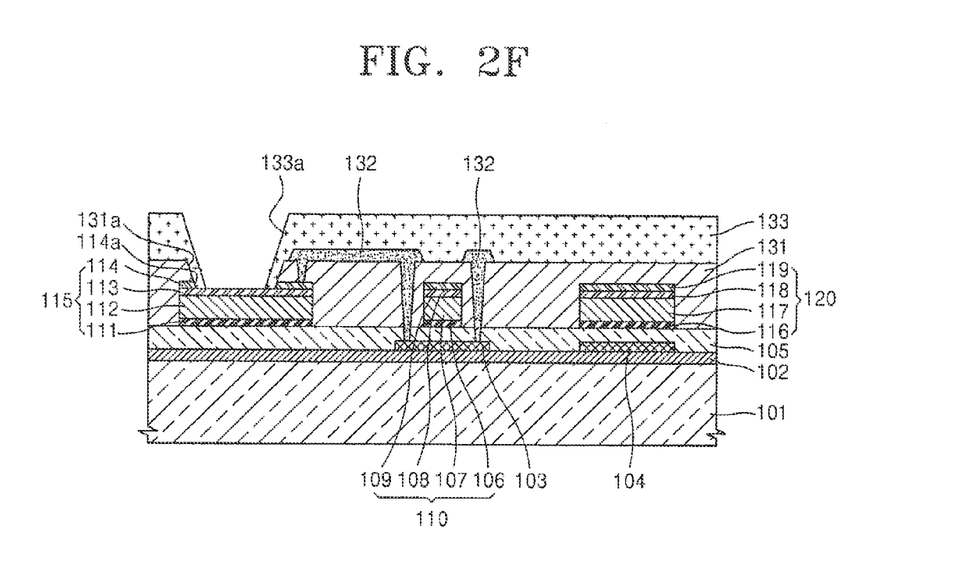

Next, referring to FIG. 2F, a pixel define layer 133 is formed on the planarization layer 131, and covers the source/drain electrode 132. The pixel define layer 133 may be formed of an organic material.

A third opening portion 133a is formed in the pixel define layer 133 to contact the first opening portion 114a or in the first opening portion 114a. The third electrode layer 113 of the pixel electrode 115 is exposed through the third opening portion 133a. In order to form the third opening portion 133a, an etching process for removing a set or predetermined region of the pixel define layer 133 is used, and during this etching process, a surface of the pixel electrode 115 may be damaged.

However, according to the current embodiment of the present invention, since the third electrode layer 113 includes crystallized ITO, the durability thereof increased. Thus the third electrode layer 113 is not affected by the etching solution.

Figure 2G:
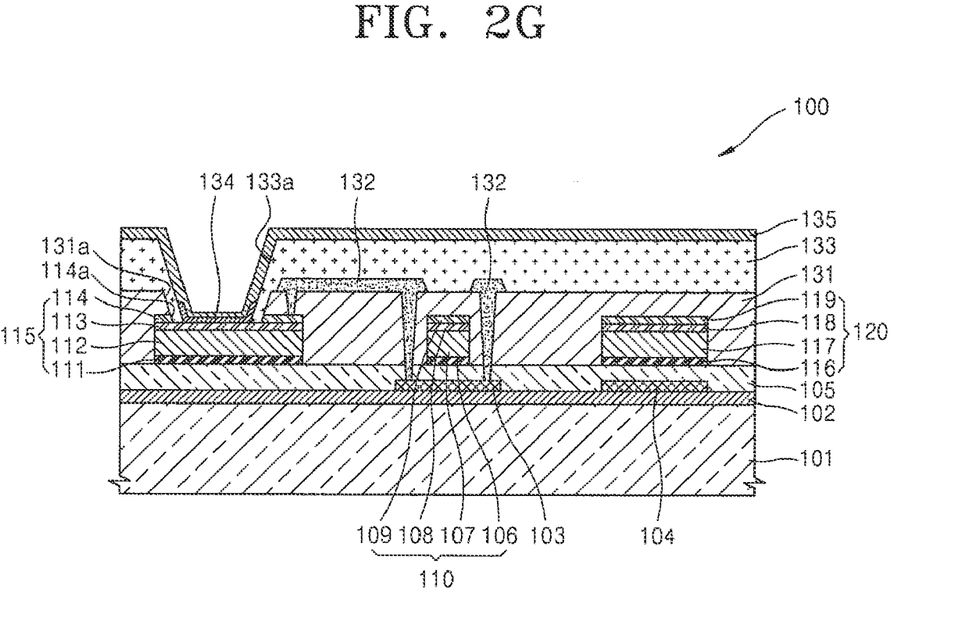

Next, referring to FIG. 2G, an intermediate layer 134 and a counter electrode 135 are sequentially formed on the third electrode layer 113 of the pixel electrode 115 exposed through the third opening portion 133a of the pixel define layer 133, and on the pixel define layer 133. The intermediate layer 134 includes an organic light emitting layer. Materials for forming the intermediate layer 134 and the counter electrode 135 are the same as described above and thus descriptions thereof will not be provided again.

Although not shown in FIG. 2G, a sealing member may be disposed on the counter electrode 135 to face a surface of the substrate 101. The sealing member is formed to protect the intermediate layer 134 from external water and/or oxygen, and is formed of a transparent material. To this end, the sealing member may be formed of glass, plastic, or a multi-layer structure of organic and inorganic materials.

According to the current embodiment of the present invention, the gate electrode 110 and the pixel electrode 115 are formed of the same materials in the same layer level. Accordingly, the manufacturing process may be simplified. Also, according to the current embodiment, the capacitor first electrode 104 is formed of the same material as and in the same layer level as the active layer 103 at the same time with the active layer 103, and the capacitor second electrode 120 is formed at the same time with the gate electrode 110, thereby further simplifying the manufacturing process.

The gate electrode 110 may have a four-layer structure in order to obtain a resistance reduction effect. Also, the third conductive layer 108 of the gate electrode 110 includes crystallized ITO and thus has increased durability, and the fourth conductive layer 109 is formed on the third conductive layer 108, thereby further protecting the third conductive layer 108. In addition, the capacitor second electrode 120 and the pixel electrode 115 have a four-layer structure, and thus the same effect in terms of reducing resistance may be obtained.

Also, the third electrode layer 113 in the portion of the pixel electrode 115 contacting the intermediate layer 134 includes crystallized ITO and thus has high durability, thereby preventing or protecting from surface damage of the third electrode layer 113 in subsequent processes. Also, the fourth electrode layer 114 is formed on the third electrode layer 113, and thus the fourth electrode layer 114 protects the third electrode layer 113 when the second opening portion 131a is formed in the planarization layer 131, thereby further preventing or protecting damage to the surface of the third electrode layer 113.

As described above, according to the one or more of the above embodiments of the present invention, the characteristics of a contact interface between the third electrode layer 113 and the intermediate layer 134 is improved, and the electric characteristics and the light emitting characteristics of the organic light emitting display apparatus 100 are improved.

According to the organic light emitting display apparatus and the method of manufacturing the same, the manufacturing process of the organic light emitting display apparatus may be simplified and the electric characteristics of the organic light emitting display apparatus may be easily improved.

While the present invention has been described in connection with certain exemplary embodiments, it is to be understood that the invention is not limited to the disclosed embodiments, but, on the contrary, is intended to cover various modifications and equivalent arrangements included within the spirit and scope of the appended claims, and equivalents thereof.

What is claimed is:

1. An organic light emitting display apparatus comprising:
a substrate;
an active layer on the substrate;
a gate electrode insulated from the active layer and composed of a first conductive layer comprising ITO, a second conductive layer on the first conductive layer, a third conductive layer on the second conductive layer and comprising ITO, and a fourth conductive layer on the third conductive layer and comprising IZO or AZO;
a pixel electrode formed in the same layer level as the gate electrode and composed of a first electrode layer comprising ITO, a second electrode layer on the first electrode layer, a third electrode layer on the second electrode layer and comprising ITO, and a fourth electrode layer on the third electrode layer and comprising IZO or AZO;
a source electrode and a drain electrode, the source and drain electrodes being insulated from the gate electrode and electrically coupled to the active layer;
an intermediate layer on the pixel electrode and comprising an organic light emitting layer; and
a counter electrode on the intermediate layer,
wherein the pixel electrode is electrically coupled to the source electrode or the drain electrode.

2. The organic light emitting display apparatus of claim 1, wherein the third electrode layer comprises crystallized ITO.

3. The organic light emitting display apparatus of claim 1, wherein the intermediate layer contacts the third electrode layer of the pixel electrode.

4. The organic light emitting display apparatus of claim 1, wherein the source electrode or the drain electrode contacts the fourth electrode layer of the pixel electrode.

5. The organic light emitting display apparatus of claim 1, wherein the fourth electrode layer of the pixel electrode comprises a first opening portion to expose the third electrode layer disposed below the fourth electrode layer.

6. The organic light emitting display apparatus of claim 5, further comprising a planarization layer for insulating the gate electrode from the source electrode and the drain electrode,
wherein the source electrode and the drain electrode are on the planarization layer, and the planarization layer comprises a second opening portion corresponding to the first opening portion.

7. The organic light emitting display apparatus of claim 6, further comprising a pixel define layer on the planarization layer, and covering the source electrode and the drain electrode, wherein the pixel define layer comprises a third opening portion contacting the first opening portion or formed in the first opening portion, and wherein the intermediate layer contacts the third electrode layer through the third opening portion.

8. The organic light emitting display apparatus of claim 1, wherein the second conductive layer comprises Ag or Al.

9. The organic light emitting display apparatus of claim 1, further comprising a capacitor comprising:
a capacitor first electrode layer formed in the same layer level as the active layer and physically separated from the active layer; and
a capacitor second electrode layer insulated from the capacitor first electrode layer and formed in the same layer level as the gate electrode to correspond to the capacitor first electrode layer.

10. The organic light emitting display apparatus of claim 9, wherein the capacitor second electrode layer comprises a first layer comprising ITO, a second layer on the first layer, a third layer on the second layer and comprising ITO, and a fourth layer on the third layer and comprising IZO or AZO.

11. The organic light emitting display apparatus of claim 10, wherein the second layer comprises Ag or Al.

12. A method of manufacturing an organic light emitting display apparatus, the method comprising:
forming an active layer on a substrate;
forming a gate electrode insulated from the active layer and composed of a first conductive layer comprising ITO, a second conductive layer on the first conductive layer, a third conductive layer on the second conductive layer and comprising ITO, and a fourth conductive layer on the third conductive layer and comprising IZO or AZO;
forming a pixel electrode in the same layer level as the gate electrode and composed of a first electrode layer comprising ITO, a second electrode layer on the first electrode layer, a third electrode layer on the second electrode layer and comprising ITO, and a fourth electrode layer on the third electrode layer and comprising IZO or AZO;
forming a source electrode and a drain electrode to be insulated from the gate electrode and electrically coupled to the active layer;
forming an intermediate layer on the pixel electrode and comprising an organic light emitting layer; and
forming a counter electrode on the intermediate layer,
wherein the pixel electrode is electrically coupled to the source electrode or the drain electrode.

13. The method of claim 12, wherein the forming of the gate electrode and the forming of the pixel electrode are performed at the same time.

14. The method of claim 12, wherein the forming of the pixel electrode comprises crystallizing the third electrode layer.

15. The method of claim 12, wherein the intermediate layer is formed to contact the third electrode layer of the pixel electrode.

16. The method of claim 12, wherein the source electrode or the drain electrode is formed to contact the fourth electrode layer of the pixel electrode.

17. The method of claim 12, further comprising forming a first opening portion in the fourth electrode layer to expose the third electrode layer before the forming of the intermediate layer.

18. The method of claim 17, further comprising forming a planarization layer on the gate electrode and the pixel electrode to insulate the gate electrode from the source electrode and the drain electrode, wherein the planarization layer comprises a second opening portion corresponding to the first opening portion.

19. The method of claim 18, wherein the first opening portion is formed by removing the fourth electrode layer exposed through the second opening portion after forming the second opening portion.

20. The method of claim 18, further comprising forming a pixel define layer on the planarization layer, covering the source electrode and the drain electrode, wherein the pixel define layer comprises a third opening portion contacting the first opening portion or formed in the first opening portion, and wherein the intermediate layer is formed to contact the third electrode layer through the third opening portion.

21. The method of claim 12, further comprising:
forming a capacitor first electrode layer in the same layer level as the active layer and physically separated from the active layer; and
forming a capacitor second electrode layer to be insulated from the capacitor first electrode layer and to correspond to the capacitor first electrode layer and in the same layer level as the gate electrode.

22. The method of claim 21, wherein the forming of the capacitor second electrode layer comprises forming a first layer comprising ITO, a second layer on the first layer, a third layer on the second layer and comprising ITO, and a fourth layer on the third layer and comprising IZO or AZO.

23. The method of claim 22, wherein the second layer comprises Ag or Al.

* * * * *